US010183590B2

(12) United States Patent
Juang et al.

(10) Patent No.: US 10,183,590 B2
(45) Date of Patent: Jan. 22, 2019

(54) ELECTRIC VEHICLE BATTERY MONITORING SYSTEM

(71) Applicant: Faraday&Future Inc., Gardena, CA (US)

(72) Inventors: Larry Way-Jay Juang, Torrance, CA (US); Xu Yan, Los Angeles, CA (US); Mayank Sikaria, Folsom, CA (US); Ruxiu Zhao, Madison, WI (US); Phillip John Weicker, Cerritos, CA (US); Anil Paryani, Cerritos, CA (US)

(73) Assignee: FARADAY&FUTURE INC., Gardena, CA (US)

( * ) Notice: Subject to any disclaimer, the term of this patent is extended or adjusted under 35 U.S.C. 154(b) by 140 days.

(21) Appl. No.: 15/275,116

(22) Filed: Sep. 23, 2016

(65) Prior Publication Data

US 2018/0086222 A1    Mar. 29, 2018

(51) Int. Cl.
| | |
|---|---|
| *B60L 11/18* | (2006.01) |
| *H02J 7/00* | (2006.01) |
| *G06N 3/00* | (2006.01) |
| *G06N 3/08* | (2006.01) |
| *G01R 31/36* | (2006.01) |

(52) U.S. Cl.
CPC ......... *B60L 11/1861* (2013.01); *B60L 11/187* (2013.01); *G01R 31/3651* (2013.01); *G06N 3/088* (2013.01); *H02J 7/0063* (2013.01); *H02J 2007/0067* (2013.01)

(58) Field of Classification Search
CPC ............... B60L 11/1861; B60L 11/187; G01R 31/3651; G06N 3/088; H02J 7/0063

USPC ......................................................... 320/136
See application file for complete search history.

(56) References Cited

U.S. PATENT DOCUMENTS

| | | | | |
|---|---|---|---|---|
| 6,016,047 | A * | 1/2000 | Notten ............... | G01R 31/3651 320/128 |
| 8,458,116 | B2 * | 6/2013 | Lupetini .............. | G05B 13/026 703/13 |
| 2003/0144764 | A1 * | 7/2003 | Yokono ................. | G06N 3/008 700/245 |
| 2004/0036437 | A1 * | 2/2004 | Ito ........................... | B25J 9/163 318/568.12 |
| 2005/0240412 | A1 * | 10/2005 | Fujita ..................... | G10L 15/16 704/270 |
| 2012/0296512 | A1 * | 11/2012 | Lee .......................... | B60K 6/48 701/29.3 |
| 2016/0236587 | A1 * | 8/2016 | Qiu ........................ | B60W 20/11 |
| 2016/0328644 | A1 * | 11/2016 | Lin .......................... | G06N 3/08 |
| 2016/0329714 | A1 * | 11/2016 | Li ............................. | H02M 7/44 |
| 2017/0028563 | A1 * | 2/2017 | Hemken .............. | B25J 11/0005 |
| 2017/0091168 | A1 * | 3/2017 | Bellegarda ............ | G06F 17/276 |
| 2017/0254858 | A1 * | 9/2017 | Weicker ............. | G01R 31/3648 |
| 2017/0346817 | A1 * | 11/2017 | Gordon .............. | G02B 27/0172 |

(Continued)

*Primary Examiner* — Stacy Whitmore
(74) *Attorney, Agent, or Firm* — Knobbe Martens Olson & Bear LLP

(57) ABSTRACT

Systems and methods for monitoring and controlling a battery are disclosed. Systems can include a battery having an output voltage and an output current when delivering power, a load driven by power delivered from the battery, battery output voltage and current sensing circuits, and processing circuitry coupled to the battery output voltage and current sensing circuits. The processing circuitry may implement a recurrent neural network for battery state estimation.

20 Claims, 9 Drawing Sheets

(56) References Cited

U.S. PATENT DOCUMENTS

2017/0371394 A1* 12/2017 Chan ................... G06F 1/3218
2018/0067918 A1* 3/2018 Bellegarda ............ G06F 17/275

* cited by examiner

Mean Epoch Voltage Error Progression During Training

Battery Voltage Prediction for the Validation dataset

ELECTRIC VEHICLE BATTERY MONITORING SYSTEM

BACKGROUND

Field

This disclosure relates to vehicle battery systems, and more specifically to systems and methods for monitoring and controlling high voltage batteries of an electric vehicle.

Description of the Related Art

Electric vehicles generally use one or more electric motors for propulsion and are powered by a battery system. Such vehicles include road and rail vehicles, surface and underwater vessels, electric aircraft, and electronic recreational devices. Electric vehicles release zero air pollutants and generate less noise than conventional combustion engine vehicles. Currently, lithium-ion batteries are often used. Battery performance may vary during use due to battery polarization or decreased charge state. In a typical electric vehicle, the battery management system (BMS) requires the estimation of battery pack power, state-of-charge (SOC), and state-of-health (SOH). These parameters are usually computed with the aid of a battery model.

The equivalent circuit battery model (ECM) is the most commonly seen. This modeling approach leverages the fact that electrochemical battery behaves similar to simple equivalent circuits to mimic battery behavior with common, linear circuit elements. However, despite the superficial similarity of battery and linear equivalent circuits, nonlinear behaviors can be observed in battery that significantly depart from the behavior of linear circuit elements. Two of the best known examples for battery nonlinearity are the Butler-Volmer relationship for charge transfer voltage drop current dependency and the lithium ion diffusion process that manifests itself as an infinite series of RC circuits.

Physics based models, e.g. the Newman model, attempt to capture electrochemical domain knowledge with physical laws and modeling techniques such as finite element analysis or single particle assumption. The physics-based models have the forms to capture nonlinear behaviors in a battery, but obtaining physical parameters such the diffusion coefficient is difficult and requires battery manufacturer's assistance.

SUMMARY

In one implementation, a battery powered apparatus comprises a battery comprising one or more electrochemical cells, the battery having an output voltage and an output current when delivering power, a load driven by power delivered from the battery, and a battery output current sensing circuit. In addition, a battery management system comprises processing circuitry coupled to the battery output current sensing circuit, the processing circuitry configured to model behavior of the battery with at least one recurrent neural network, the at least one recurrent neural network comprising a set of input layer nodes, a set of hidden layer nodes, and a set of output layer nodes, and wherein at least some of the hidden layer nodes receive at least one input from an input layer node and at least one input from a previous time state of a hidden layer node.

In another implementation, a method of operating a battery powered apparatus comprises driving a load of the apparatus with a battery, sensing the output current of the battery at defined intervals while driving the load, predicting an output voltage that will be exhibited by the battery under selected output current conditions using at least one recurrent neural network, the at least one recurrent neural network comprising a set of input layer nodes, a set of hidden layer nodes, and a set of output layer nodes, and wherein at least some of the hidden layer nodes receive at least one input from an input layer node and at least one input from a previous time state of a hidden layer node, and driving the load of the apparatus with the selected current sourced from the battery.

In another embodiment, an electric vehicle with a battery monitoring system comprises a battery, a powertrain comprising at least one electric motor driven by the battery, and a battery output current sensing circuit. Processing circuitry is coupled to the battery output voltage sensing circuit and the battery output current sensing circuit, the processing circuitry configured to model behavior of the battery with at least one recurrent neural network, the at least one recurrent neural network comprising a set of input layer nodes, a set of hidden layer nodes, and a set of output layer nodes, and wherein at least some of the hidden layer nodes receive at least one input from an input layer node and at least one input from a previous time state of a hidden layer node.

BRIEF DESCRIPTION OF THE DRAWINGS

The above-mentioned aspects, as well as other features, aspects, and advantages of the present technology will now be described in connection with various implementations, with reference to the accompanying drawings. The illustrated implementations are merely examples and are not intended to be limiting. Throughout the drawings, similar symbols typically identify similar components, unless context dictates otherwise.

DETAILED DESCRIPTION

The following description is directed to certain implementations for the purpose of describing the innovative aspects of this disclosure. However, a person having ordinary skill in the art will readily recognize that the teachings herein can be applied in a multitude of different ways. In some implementations, the word "battery" or "batteries" will be used to describe certain elements of the embodiments described herein. It is noted that "battery" does not necessarily refer to only a single battery cell. Rather, any element described as a "battery" or illustrated in the Figures as a single battery in a circuit may equally be made up of any larger number of individual battery cells and/or other elements without departing from the spirit or scope of the disclosed systems and methods.

Electric vehicles typically include a high voltage battery system having significant energy and power storage capacity, suitable for powering electric traction motors. In addition to powering the vehicle's propulsion motors, the high voltage batteries' output may be stepped down using one or more DC-to-DC converters to power some or all of the other vehicle systems, such as interior and exterior lights, power assisted braking, power steering, infotainment, automobile diagnostic systems, power windows, door handles, and various other electronic functions when the high voltage batteries are engaged. Lithium-ion batteries are frequently used in the high voltage battery systems of electric vehicles. An electric vehicle may have a battery pack comprising a number of individual lithium-ion cells, which may be connected in a combination of parallel and series connections in order to provide sufficient voltage and energy capacity to power the systems described above.

During operation of an electric vehicle, it is important to monitor the state of the high voltage battery pack for a variety of reasons. Monitoring the state of charge (SOC) of the battery pack allows the vehicle to determine an estimate of the remaining mileage that can be traveled before recharging the batteries, and this range estimate can be delivered to the user. The inability of the battery to hold and deliver charge at a desirable rate may indicate that battery maintenance is required. In addition, the state of the battery can determine an instantaneous power limit, which may affect the ability of the battery to provide the necessary currents for certain high torque requests. Thus, knowledge of the power limit can allow the vehicle to determine an appropriate accelerator pedal map that correlates pedal position with motor torque commands and adjust the pedal map as necessary.

Battery state monitoring in such an environment is challenging because a lithium-ion battery pack does not behave as an ideal battery cell. Among the most salient differences between real and ideal batteries are the polarization and internal resistance present in real batteries.

Figure 1:
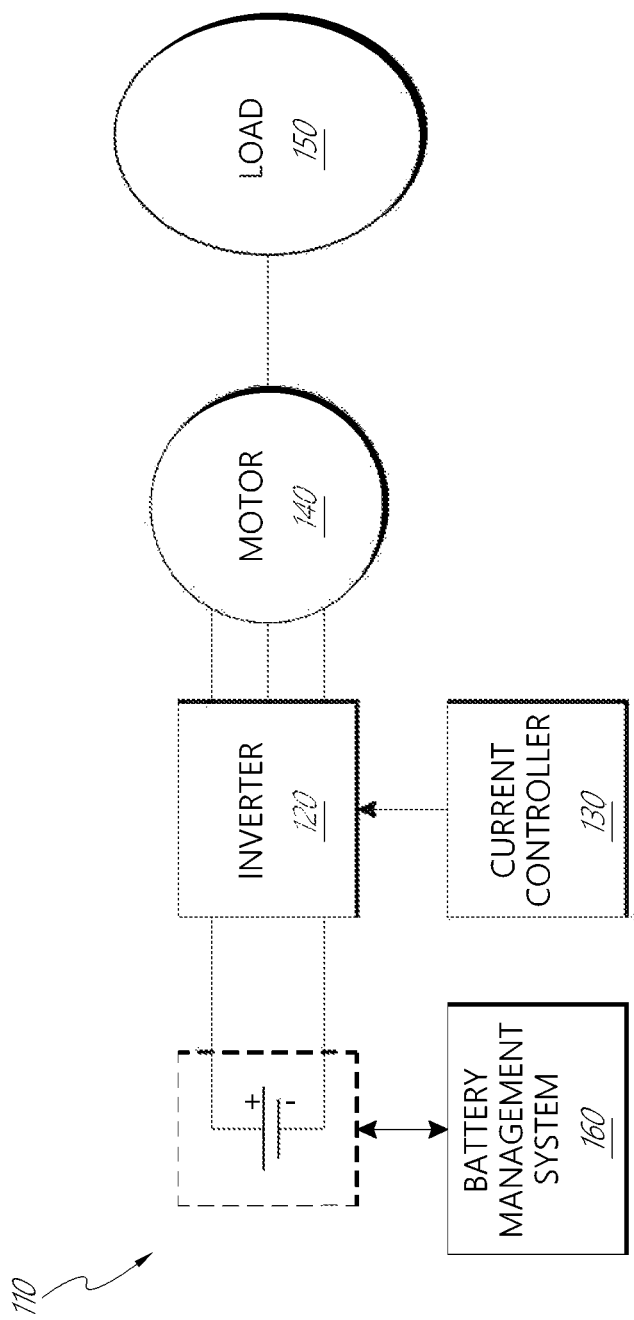
FIG. 1 is a block diagram of an example electric vehicle drive system according to one embodiment.

FIG. 1 depicts a block diagram of an example electric vehicle drive system 100 including a battery management system 160. The electric vehicle drive system 100 includes the battery or voltage source 110, an inverter 120 coupled to the battery 110, a current controller 130, a motor 140, and load 150, and the battery management system 160. The battery 110 can be a single phase direct current (DC) source. In some embodiments, the battery 110 can be a rechargeable electric vehicle battery or traction battery used to power the propulsion of an electric vehicle including the drive system 100. Although the battery 110 is illustrated as a single element in FIG. 1, the battery 110 depicted in FIG. 1 is only representational, and further details of the battery 110 are discussed below in connection with FIG. 2.

The inverter 120 includes power inputs which are connected to conductors of the battery 110 to receive, for example, DC power, single-phase electrical current, or multi-phase electrical current. Additionally, the inverter 120 includes an input which is coupled to an output of the current controller 130, described further below. The inverter 120 also includes three outputs representing three phases with currents that can be separated by 120 electrical degrees, with each phase provided on a conductor coupled to the motor 140. It should be noted that in other embodiments inverter 120 may produce greater or fewer than three phases.

The motor 140 is fed from voltage source inverter 120 controlled by the current controller 130. The inputs of the motor 140 are coupled to respective windings distributed about a stator. The motor 140 can be coupled to a mechanical output, for example a mechanical coupling between the motor 140 and mechanical load 150. Mechanical load 150 may represent one or more wheels of the electric vehicle.

Controller 130 can be used to generate gate signals for the inverter 120. Accordingly, control of vehicle speed is performed by regulating the voltage or the flow of current from the inverter 120 through the stator of the motor 140. There are many control schemes that can be used in the electric vehicle drive system 100 including current control, voltage control, and direct torque control. Selection of the characteristics of inverter 120 and selection of the control technique of the controller 130 can determine efficacy of the drive system 100.

The battery management system 160 can receive data from the battery 110 and generate control signals to manage the battery 110. As will be described further below, the battery management system 160 may also generate battery state parameters that may be used to control the operation of the electric vehicle.

Figure 2:
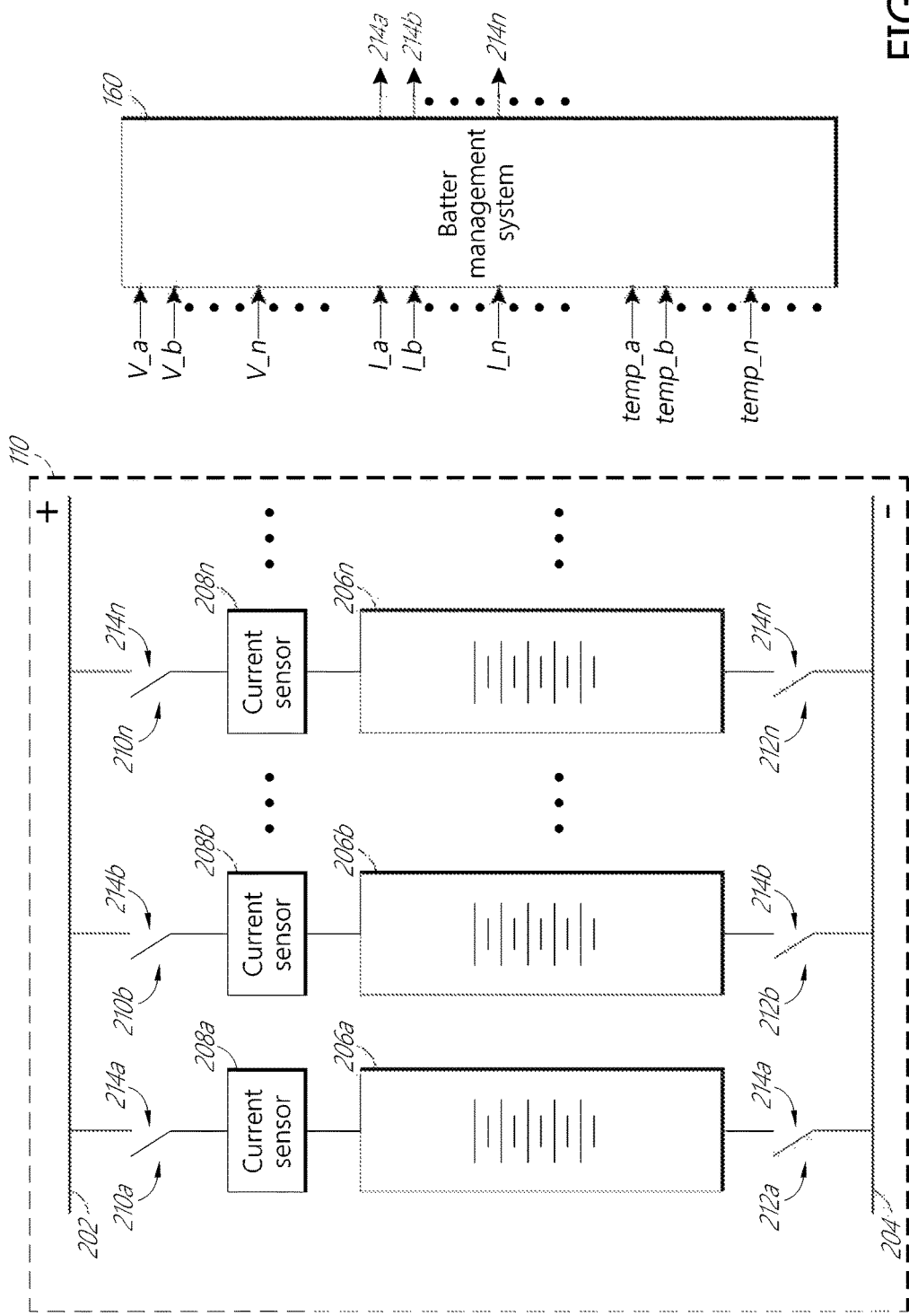
FIG. 2 is block diagram of example voltage source and battery management system according to one embodiment.

FIG. 2 is a block diagram of an example voltage source according to one embodiment. The voltage source 110 can include a plurality of battery strings 206a, 206b, . . . 206n, . . . , individually or collectively referred to herein as the battery string(s) 206, and a plurality of current sensors 208a, 208b, . . . , 208n, . . . , individually or collectively referred to herein as the current sensor(s) 208. The battery strings 206 can be individually connected to or disconnected from a positive or high power bus 202 and a negative or low power bus 204 through a plurality of switches 210a, 210b, . . . , 210n, . . . , and 212a, 212b, . . . , 212n, . . . , individually or collectively called the switches 210 and 212. The switches 210 and 212 can be controlled by control signals from a battery management system 160. The battery management system 160 can receive, among others, voltages, V_a, V_b, . . . , V_n, . . . , which are output voltages across the respective battery strings 206a, 206b, . . . , 206n, . . . , determined using, for example a plurality of sensors (not shown). The battery management system 160 can also receive currents, I_a, I_b, . . . , I_n, . . . , which are currents from the respective battery strings 206a, 206b, . . . , 206n, . . . , measured by the respective current sensors 208a, 208b, . . . , 208n, . . . . The battery management system 160 also can receive temperature measurements, temp_a, temp_b, . . . , temp_n, . . . , which are one or more of temperature measurements from the respective battery strings 206a, 206b, . . . 206n, . . . , measured by one or more temperature sensors (not shown) accompanying the battery strings. Based at least in part on the voltages, V_a, V_b, . . . , V_n, . . . , currents, I_a, I_b, . . . , I_n, . . . , and/or temperatures, temp_a, temp_b, . . . , temp_n, of the respective battery strings 206, the battery management system 160 can generate control signals 214a, 214b, . . . , 214n, . . . , individually or collectively referred to herein as the control signal(s) 214, for controlling the respective switches 210 and 212.

The battery strings 206 can include a plurality of modules, each of which in turn can include a plurality of cells. Within each battery string 206, the constituent modules and cells can be connected in series as symbolically depicted in FIG. 2. In some embodiments, the voltage source 110 can include six battery strings 206 that can be connected to or disconnected from the power buses 202, 204. The battery strings 206 can be implemented with various different types of rechargeable batteries made of various materials, such as lead acid, nickel cadmium, lithium ion, or other suitable materials. In some embodiments, each of the battery strings can output about 375V-400V if charged about 80% or more.

The current sensors 208 can be connected in series with the respective battery strings 206 between the high and low power buses 202, 204. As shown in FIG. 2 the current sensor 208 can be connected to the positive side of the respective battery strings 206 to measure the current discharged from the battery strings 206. In other embodiments, the current sensors 208 can be connected to the battery strings 206 otherwise to measure the current flow due to discharging of the battery strings 206. The current sensors 206 can be implemented as hall effect sensors, series shunts, or any other known current measurement device.

The switches 210 and 212 can be contactors configured to connect the battery strings 206 to the power buses 202, 204 or disconnect the battery strings 206 from the power buses 202, 204 in response to the respective control signals 214. The switches 210 can be implemented with any suitable contactors capable of handling the level of current and voltage as needed in connection with, for example, the battery strings 206, the power buses 202, 204, and the load 150 (FIG. 1) within the electric vehicle drive system 100 (FIG. 1). In some embodiments the switches 210 and 212 can be implemented with mechanical contactors with solenoid inside. In some embodiments, the switches 210 can be powered by one or more drivers in the battery management system 160. Although in the illustrated example in FIG. 2, the switches 210 (e.g., 210$n$) and the switches 212 (e.g., 212$n$) are controlled by the same respective control signals 214 (e.g., 214$n$), in other embodiments, the switches 210 (e.g., 210$n$) can be controlled by respective positive bus connect control signals while the switches 212 (e.g., 212$n$) can be controlled by respective negative bus connect control signals.

The battery management system 160 can include a plurality of passive and/or active circuit elements, signal processing components, such as analog-to-digital converters (ADCs), amplifiers, buffers, drivers, regulators, or other suitable components to, for example, sample and digitize the signals received by the battery management system. In some embodiments, the battery management system 160 can also include one or more processors to process incoming data to generate outputs, such as the control signals 214. In some embodiments, the battery management system 160 can also include one or more components for communicating and sending and receiving data within the battery management system 160 and/or with other components or circuitries in the electric vehicle. For example, the various components and circuits within the system 100, including components in the battery management system 160 can be in communication with one another using protocols or interfaces such as a CAN bus, SPI, or other suitable interfaces. And in some embodiments, the processing of incoming data can be at least in part performed by other components not in the battery management system 160 within the electric vehicle as the battery management system 160 communicates with other components.

One function of the battery management system 160 is determining the current state of the battery in terms of remaining charge, status of health, and available power that can be delivered in response to driver requests for torque. As mentioned above, a battery model is often implemented in the battery management system to determine these parameters as the vehicle is driven. Three main physical domains are involved in this modeling problem: electrical, thermal, and electrochemical. These domains may be either implicitly or explicitly included in a given battery model. Adding the thermal dimension explicitly to battery modeling is particularly challenging because the two mechanisms of heat generation, resistive heating and endothermic/exothermic reactions, are both dependent on battery nonlinear behaviors. As an example, the heat generated with electric current through battery changes the battery pure resistance and charge transfer via temperature change, and the changes in battery properties in turn alter the heat generation rate.

While limited work has been done on using neural networks for battery modeling, these have not been particularly successful. The inventors have found that one problem with the applicability of traditional neural network techniques to battery modeling is that a battery state at a given time depends on a relatively long temporal sequence of output currents. Typical applications of neural networks do not work well under these conditions. To deal with this problem, the inventors have implemented Recurrent Neural Networks (RNN) for battery modeling.

The RNN is a type of multi-layered neural network that retains memory from the previous iteration. Such internal memory helps process arbitrary sequences of inputs (e.g., current, temperature, amp-hour), to output dynamic temporal behavior of the battery (e.g., voltage). The RNN integrates coherently with the backpropagation training method and the stochastic gradient descent optimization method, to learn the appropriate internal representations of a mapping of input to output. Compared to the ECM and the physics based models, a RNN captures the battery nonlinearity, takes the temperature dependency into account, and does not require foreknowledge of battery physical parameters.

Figure 3:
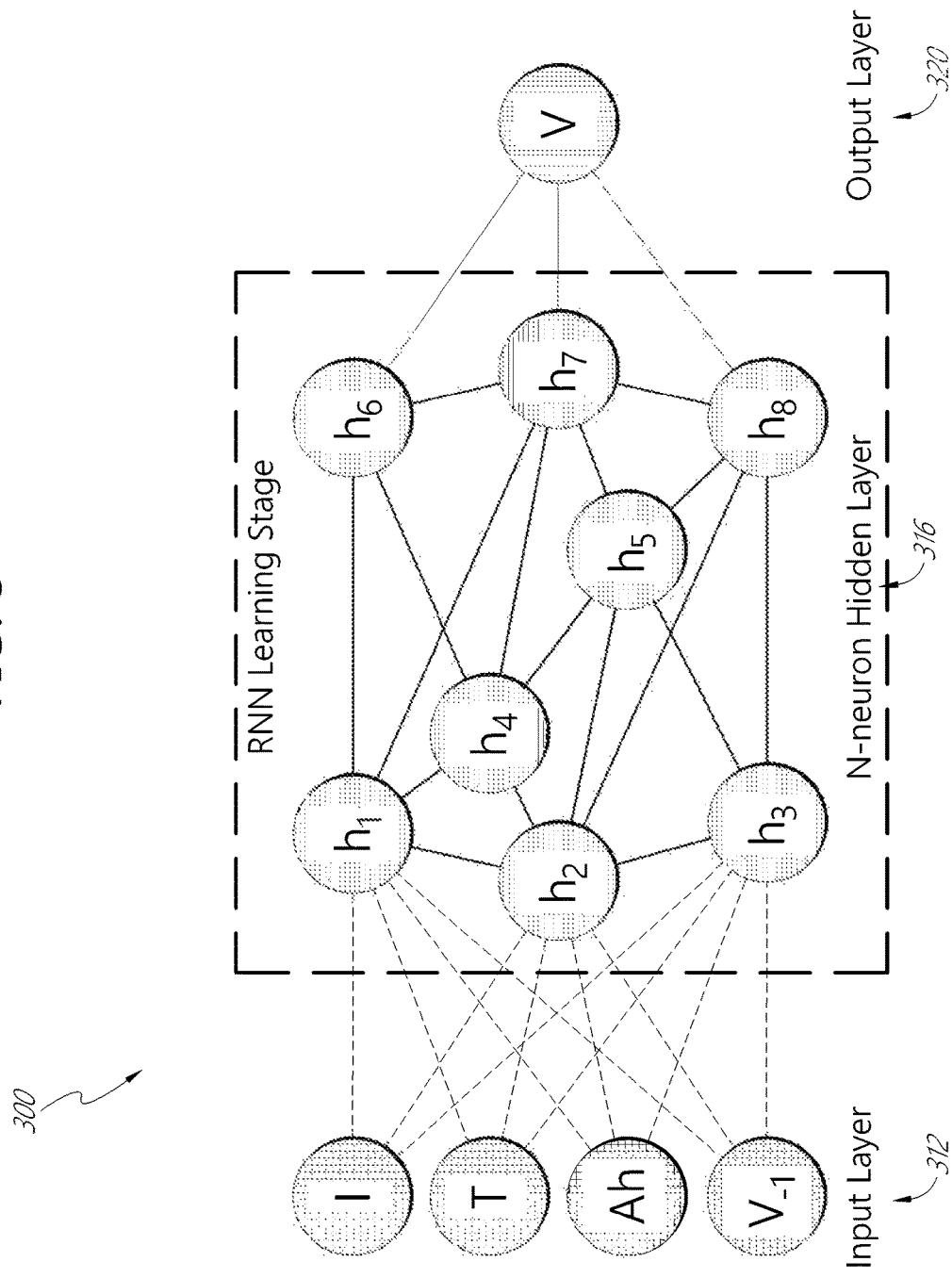
FIG. 3 is a block diagram of battery model using a recurrent neural network.

An example of a recurrent neural network 300 for battery modeling is illustrated in FIG. 3. This RNN system contains three layers: an input layer 312, a hidden layer 316, and an output layer 320. The output layer 320 in this embodiment contains one neuron, the battery voltage response. The input neurons include battery output current, battery temperature, and the amp-hour count of the battery (e.g. integrated battery output current). An input of the previous time step voltage response output of the RNN may also be utilized as an input. The amp-hour count data contains information regarding battery SOC and open-circuit-voltage (OCV).

At a given time step t, an RNN in general receives an input vector $x_t$ and produces an output vector $y_t$. For the example network 300 of FIG. 3, the input vector has four entries corresponding to battery current, battery temperature, integrated current from t=0 to t, (e.g. amp-hours of prior operation) and the battery voltage output from the output layer 320 at time $t_{-1}$. The output vector in this embodiment has a single entry (with a scalar being considered a one entry vector), the predicted battery output voltage. The state of the hidden nodes at time t, $h_t$, is also a vector, with the example of FIG. 3 being eight entries long and that may be computed as:

$$h_t = g(Vx_t + Uh_{t-1} + b_h) \quad (1)$$

Where V and U are weight matrices, $b_h$ is an offset vector, and g is a nonlinear function such as a sigmoid or tan h. Weight matrix V defines how much of each input node is added to each hidden node. Weight matrix U defines how much of the previous time state of each hidden layer node is added to this time state of each hidden layer node. It is the $Uh_{t-1}$ term that makes this an RNN, since the prior state of the hidden layer is used when computing the next state of the hidden layer. At time t=0, the initial values of the vector $h_0$ may be set to all zeros.

The output vector $y_t$ may be computed as:

$$y_t = Wh_t + b_y \quad (2)$$

where W is another weight matrix and $b_y$ is another offset vector. Because the output in this implementation is a predicted physical voltage value, no scaling with a non-linear function is performed at this output step.

The inventors have also found that the performance of a recurrent neural network for battery modeling is further improved when gating is used as part of the hidden state computation. Gating refers to the use of additional vectors in the hidden state computation that allow the neural network to have longer term memory, which the inventors have found is especially important in accurate battery modeling. In one form of such a gated RNN, the hidden state $h_t$ may be computed as:

$$u_t = g(Px_t + Zh_{t-1} + b_u) \quad (3)$$

$$r_t = g(Qx_t + Mh_{t-1} + b_r) \quad (4)$$

$$s_t = g(Vx_t + U(h_{t-1} \circ r_t) + b_s) \quad (5)$$

$$h_t = (1-u_t) \circ s_t + u_t \circ h_{t-1} \quad (6)$$

Here, P, Z, Q, M, V, and U are again weight matrices, and $b_u$, $b_r$, and $b_s$ are offset vectors. The 1 is a vector having a 1 for each entry, the + represents vector addition, which is element-wise addition that generates a result vector having entries that are the respective sums of corresponding elements of two starting vectors, and the ∘ represents element-wise multiplication that generates a result vector having entries that are the respective products of corresponding elements of two starting vectors. The functions g are non-linear functions that may or may not be the same in each equation. The output is computed the same way from the hidden state $h_t$ as in the ungated RNN described above in Equation 2. In this implementation, the vectors $r_t$ and $u_t$ have the same size as the hidden state $h_t$, and may be referred to as gates, with $r_t$ called a reset gate, and $u_t$ called an update gate. These gates determine how much of the prior hidden state is fed through to the new hidden state, versus how much of the inputs are fed into the new hidden state. Other forms of gated RNNs can also be used that function similarly. Some such embodiments have three gates, generally known as an input gate, a forget gate, and an output gate. In these embodiments, the hidden state vector may be computed as follows:

$$i_t = g(Px_t + Zh_{t-1} + b_i) \quad (7)$$

$$f_t = g(Qx_t Mh_{t-1} + b_f) \quad (8)$$

$$o_t = g(Nx_t + Rh_{t-1} + b_o) \quad (9)$$

$$s_t = g(Vx_t + Uh_{t-1} b_s) \quad (10)$$

$$c_t = c_{t-1} \circ f_t + s_t \circ i_t \quad (11)$$

$$h_t = g(c_t) \circ o_t \quad (12)$$

Here, P, Z, Q, M, N, R, V, and U are again weight matrices, and $b_i$, $b_f$, $b_o$, and $b_s$ are offset vectors. The + represents vector addition, which is element-wise addition that generates a result vector having entries that are the respective sums of corresponding elements of two starting vectors, and the ∘ represents element-wise multiplication that generates a result vector having entries that are the respective products of corresponding elements of two starting vectors. The functions g are non-linear functions that may or may not be the same in each equation. The output is computed the same way from the hidden state $h_t$ as in the ungated RNN described above in Equation 2. In this implementation, the vectors $i_t$, $f_t$, and $o_t$ are the gates, with $i_t$ called the input gate, $f_t$ called the forget gate, and $o_t$ called the output gate.

Unlike the traditional feed-forward type Artificial Neural Networks (ANN), such RNN has the advantage of using small batches of training data to build up the computational graph for the network with the stochastic gradient descent optimization method. Since it is a model with memory, at each time step during a single learning session, the output of the hidden units will be fed by some inputs and the state of the hidden units in the previous time step. Then the output layer signal is calculated through a linear function over the hidden neurons. This learning process allows the RNN to capture the dynamic features of the battery and learn the structure in the battery data. After that, the RNN is able to achieve a long term memory about the structure relating battery states. Specifically, the RNN has the advantage to capture the electrochemical process inside the battery, especially the diffusion phenomenon which has a long time constant.

Figure 4:
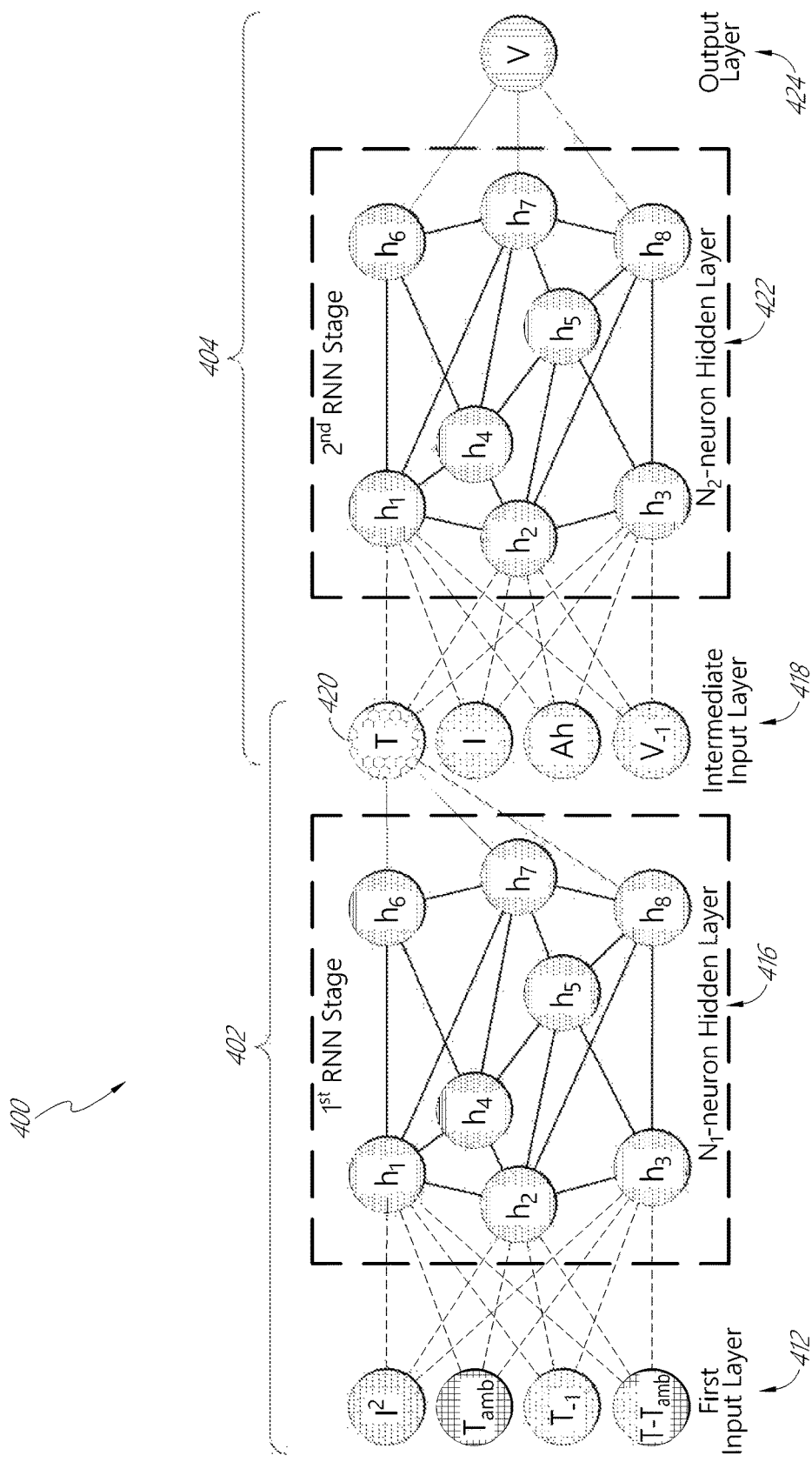
FIG. 4 is a block diagram of a battery model using a first recurrent neural network to produce a temperature input for a second recurrent neural network.

In another implementation illustrated in FIG. 4, a battery model RNN 400 is organized as two RNNs, with one RNN 402 mapping battery current and ambient temperature information to battery temperature progression, followed by another RNN 404 that further maps battery current, amp-hour information and battery temperature to battery output voltage. The output layer of the first RNN provides values for the input layer of the second RNN. This two-RNN system separates out the thermal behavior of the battery and provides a battery thermal model. Instead of using the temperature data as an input neuron, a RNN is constructed to first learn the dynamic thermal behavior of the battery due to the electrochemical process. This first RNN 402 uses the square of the battery current, the ambient temperature, the battery temperature from the previous time step, and the difference between the battery temperature at the previous time step and the ambient temperature as the inputs at input layer 412 and provides a predicted battery temperature as the output 420, with the hidden layer 416 in between. Then, this learned thermal information 420 is fed together with electrical information into the second RNN 404 leading to the battery voltage response as the output. The second RNN 404 uses the same parameter inputs as the single RNN 300 of FIG. 3 as its input layer 418, except instead of a measured battery temperature, the temperature output from the first RNN 402 of FIG. 4 is used as the battery temperature input. The two RNNs 402 and 404 of FIG. 4 can each be an ungated or gated RNN such as described above with respect to FIG. 3, although as noted above, the inventors have found that forming both as gated RNNs generally provides better performance.

In general, the goal of the training process for a neural network such as those described above is setting the entries of the weight matrices and offset vectors in the formulas set forth above to produce an accurate mapping of inputs to outputs under a wide variety of operating conditions including different ambient temperatures and time-wise current profiles as a battery is discharged into a load. During a training process, training data for the network inputs to the input layer and output(s) of the output layer gathered from experimental measurements on one or more batteries of interest is utilized. The weight and offset parameters may be updated, for example, through backpropagation process using stochastic gradient descent as training data inputs are fed into the network, and the network outputs are compared to the measured outputs of the training data. The gradients for each parameter may be calculated based on a cost function of the squared error between the measured output value (measured voltage) and the forward predicted output value (estimated voltage) at every time step in the training data. The goal is to keep adjusting the parameters so that the cost function approaches zero.

For the RNN 300 of FIG. 3, the input layer contains four pieces of time series data, battery current, battery Amp-hour (integrated current), battery temperature, and the previous time state battery voltage. The output layer contains one piece of time series data, measured battery voltage. The training data bank contains a large number of full or partial battery discharge data sets. Each data set corresponds to a particular ambient temperature and has a defined battery current profile over the course of the data set. The start and end states of each data set, such as the initial and final charge state of the battery may vary for different data sets. The data sets span a wide range of ambient temperatures (such as −15 degrees C. to 25 degrees C. or more) and time-wise output current profiles.

A training "epoch" is defined as one error backpropagation cycle of all the training data through the network. The whole training process may advantageously include a fairly large number of epochs, for example about 300-400. Prior to performing each training epoch, the different data sets in the data bank may be randomized in order and then sequentially selected for training so the parameters are updated to be generalized for different temperatures and current profiles.

After training is done (e.g. error stabilized), a validation dataset that wasn't included in the training data sets may be used for validating the predictive accuracy of the RNN model. During validation, the first time-step input states include battery current at time zero, amp-hour at time zero, temperature at time zero, and measured voltage at time −1 (essentially the same as at time 0). Initializing this input to the specific measured voltage allows the RNN model to know where the battery voltage status is initially, instead of guessing. This improves model performance and is true in practice since there is always an initial battery voltage that the system knows. For the validation at following time steps, the input states change and become battery current at current time step, amp-hour at current time step, battery temperature at current time step, and the RNN predicted voltage at the previous time step. In this fashion, this RNN model is still an open-loop predictive model for battery dynamics since the model does not know any output (voltage) information prior to the prediction, except for time zero situation.

For training the two RNN structure of FIG. 4, this structure can be seen as training two RNNs in parallel. As described above, the first input layer contains the square of the current, the ambient temperature, the previous time state battery temperature, and the difference between the ambient temperature and the previous time state battery temperature, and the output layer contains the battery temperature. The other parallel-trained RNN is: input layer contains current, amp-hour, battery temperature, and the previous time state battery voltage and the output layer is the measured battery voltage.

For each of the two parallel-trained RNN, the other training process is very similar to that utilized for the single RNN model of FIG. 3. One slight difference is that during training the RNN battery thermal model, the cost function is the squared error between the measured temperature value and the forward predicted temperature value, instead of a voltage comparison previously.

As with the single RNN model, after training is done (error stabilized), a validation dataset that wasn't included in the training data bank is used for validating the predictive accuracy of the RNN model. For initialization of the first RNN at time zero, the square of the input battery current at time zero is used, as well as ambient temperature at time zero, measured battery temperature at time −1 (essentially the same as at time 0), and the difference between the ambient temperature and the measured battery temperature at time −1. The RNN 402 will then predict the battery temperature for time 0.

For the second RNN, battery current at time zero is used, as well as amp-hour at time zero, predicted temperature at time zero, and measured voltage at time −1 (essentially the same as at time 0). The RNN 404 will then predict battery voltage of time 0.

For future times k, battery current at time k is used along with ambient temperature at time k, predicted battery temperature at time k−1, and the difference between the ambient temperature and the predicted battery temperature at time k−1, and the output of RNN 402 will be predicted battery temperature at time k. For the second RNN 404, battery current at time k, amp-hour at time k, predicted temperature of time k from RNN 402, and predicted voltage at time k−1. RNN 404 will then predict battery voltage at time k.

One advantage of the two-layer RNN structure of FIG. 4 is that after training, it eliminates the necessity of any temperature sensing (except the initial cell temperature or using the ambient temperature as the initial cell temperature assuming the cell is in thermal equilibrium at first), since it has already constructed a thermal model. In sum, as long as the initial temperature and voltage of the battery is known, this two-layer RNN 400 is capable of, in open loop, predicting the battery thermal behavior and electrical behavior. Both of them are very useful for battery power prediction and setting electrical and thermal limits.

Both RNN structures formulate accurate battery dynamic models and effectively tackle the difficulties of the ECM and physics based models. They are also suitable to be implemented into the BMS algorithm and estimate battery states, including battery power, SOC, and SOH. These RNN algorithms are expected to overcome the estimation difficulties associated to both the ECM and the physics based model, and are suitable to be integrated into the BMS for better battery state estimation.

Figure 5A:
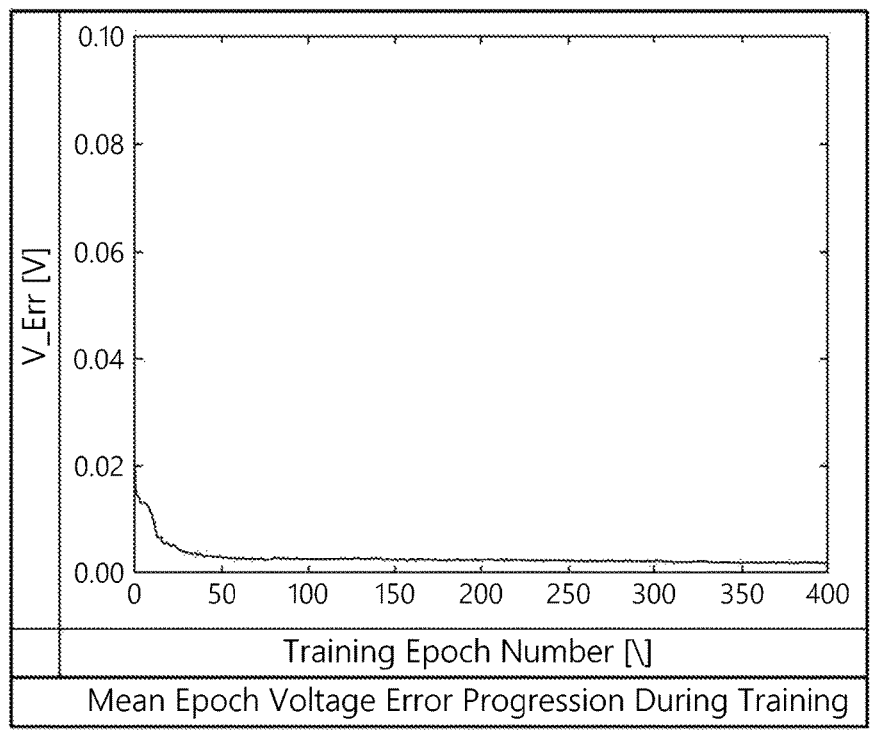
FIGS. 5A, 5B, and 5C are graphs illustrating the performance of a recurrent neural network according to FIG. 3.
Figure 5B:
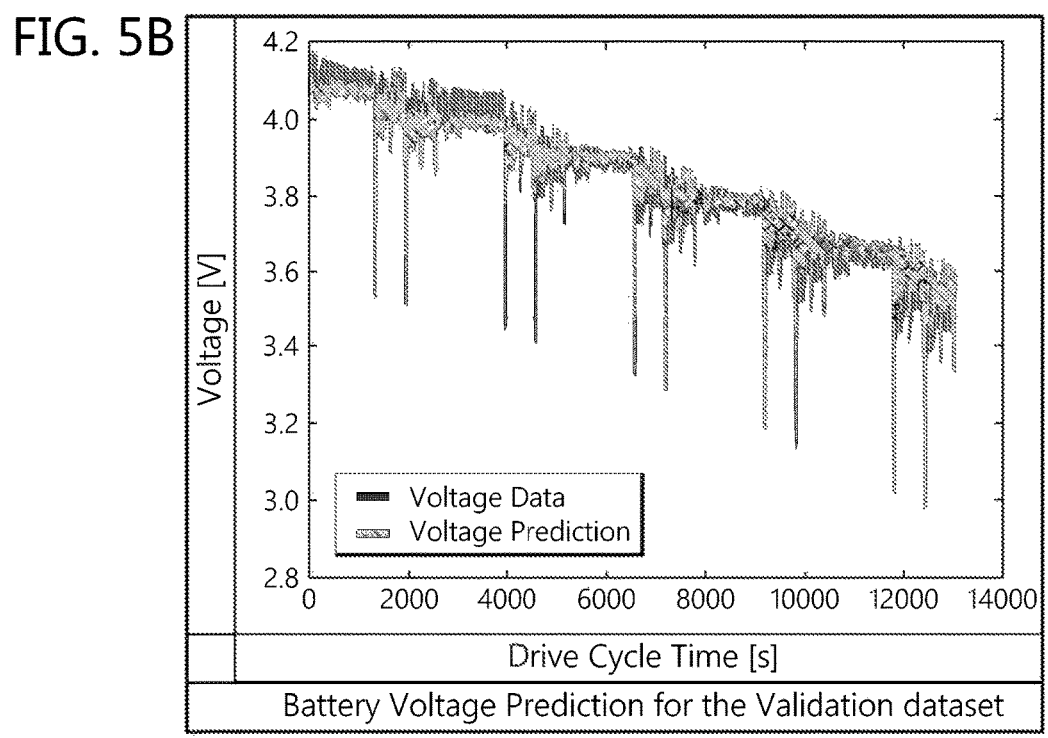
Figure 5C:
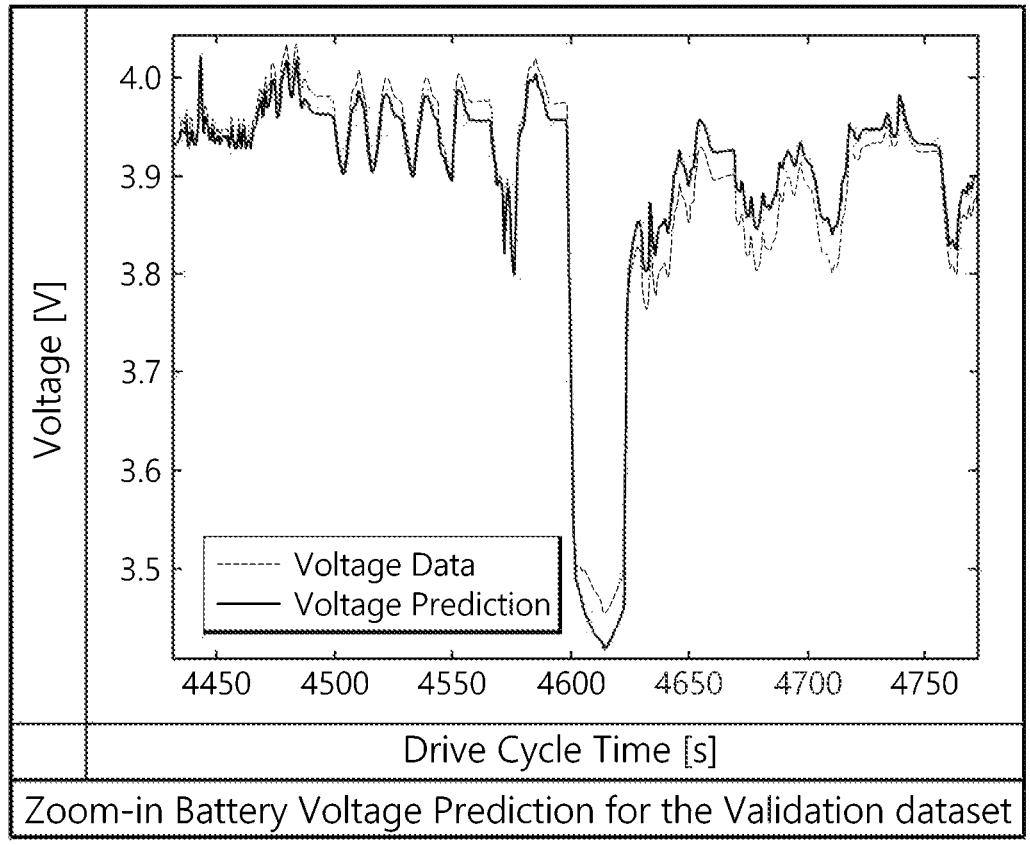
Figure 6A:
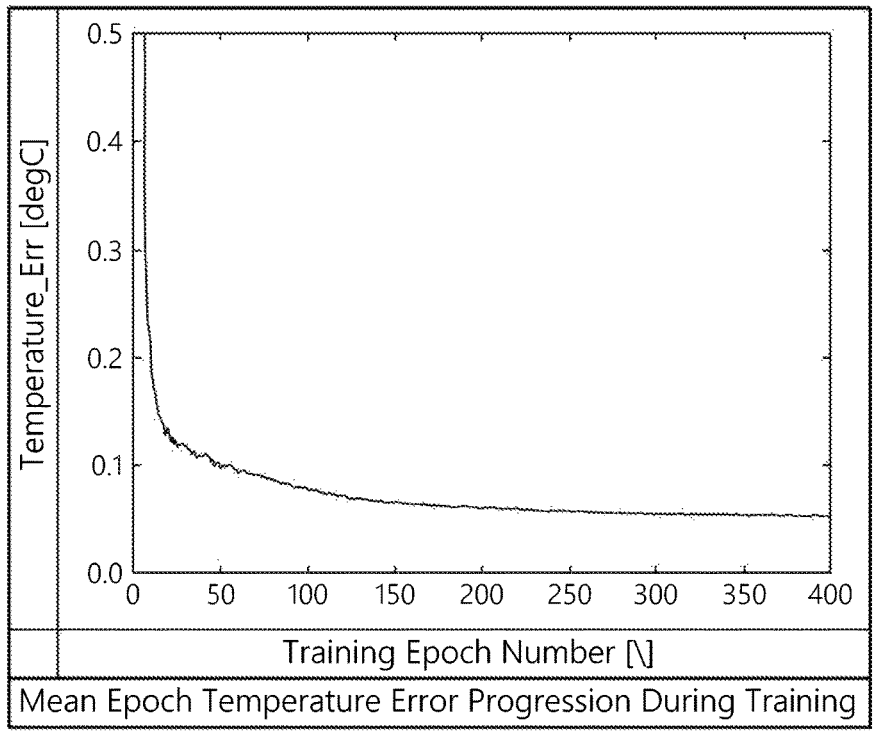
FIGS. 6A, 6B, and 6C are graphs illustrating the performance of a recurrent neural network according to FIG. 4.
Figure 6B:
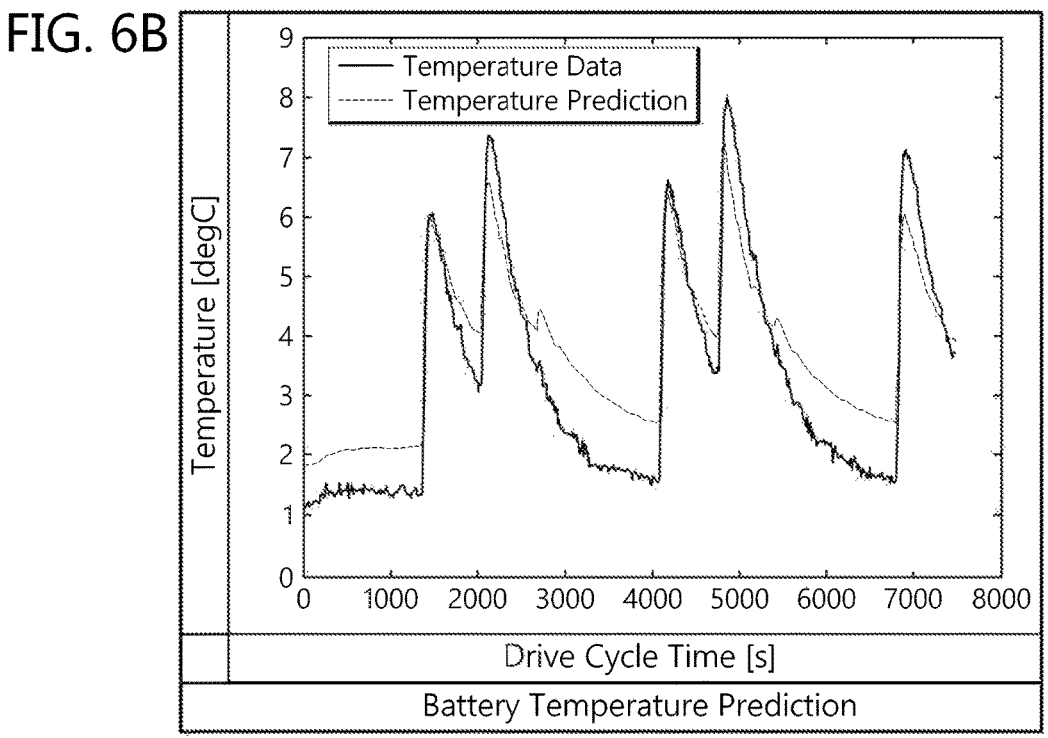
Figure 6C:
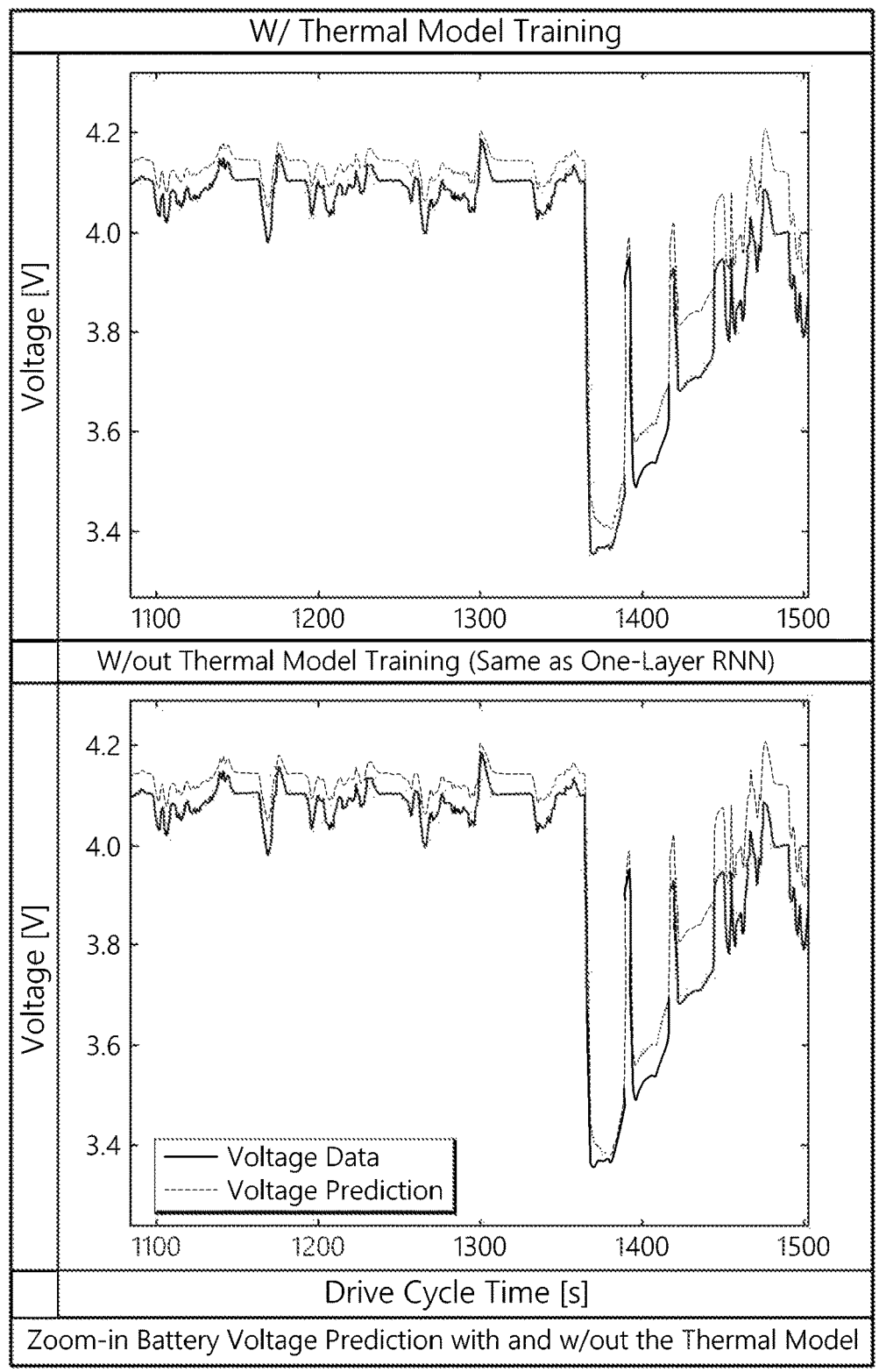

FIGS. 5A-5C illustrate the performance of an exemplary RNN according to FIG. 3 and Equations (3) through (6) above having 30 hidden states. FIG. 5A illustrates output error reduction during the training process. FIGS. 5B and 5C show the performance of the model as compared to the validation data set. FIGS. 6A-6C illustrate the performance of an exemplary RNN according to FIG. 4 and Equations (3) through (6) above also having 30 hidden states. FIG. 6A illustrates temperature error progression during training and FIG. 6B illustrates the models temperature prediction as compared to the validation data set. FIG. 6C shows that the two layer model with no physical temperature measurement performs substantially as well as the model of FIG. 3.

In practice, after the vehicles are operating under normal driving conditions, the parameters in the RNN are desired to be kept trained and updated so that the RNN would recognize a more generalized mapping pattern and also be able to account for the battery aging. To accomplish this, updated weights can be downloaded to the vehicle battery management system wirelessly when desired, where the updated weights are computed by gathering actual on-road driving data from different comparable vehicles. Thus, the RNN could continue its training as new data is gathered during car use and compared to the model predictions. In some cases, on-road data could be gathered from both vehicles driving mainly in colder areas such as Minnesota and vehicles in hotter areas such as California. This allows the RNN to be further trained and also generalized to various temperature conditions. Cloud computing facilities for receiving data from the vehicles and sending updated weights back to the vehicles could be used for this process.

Figure 7:
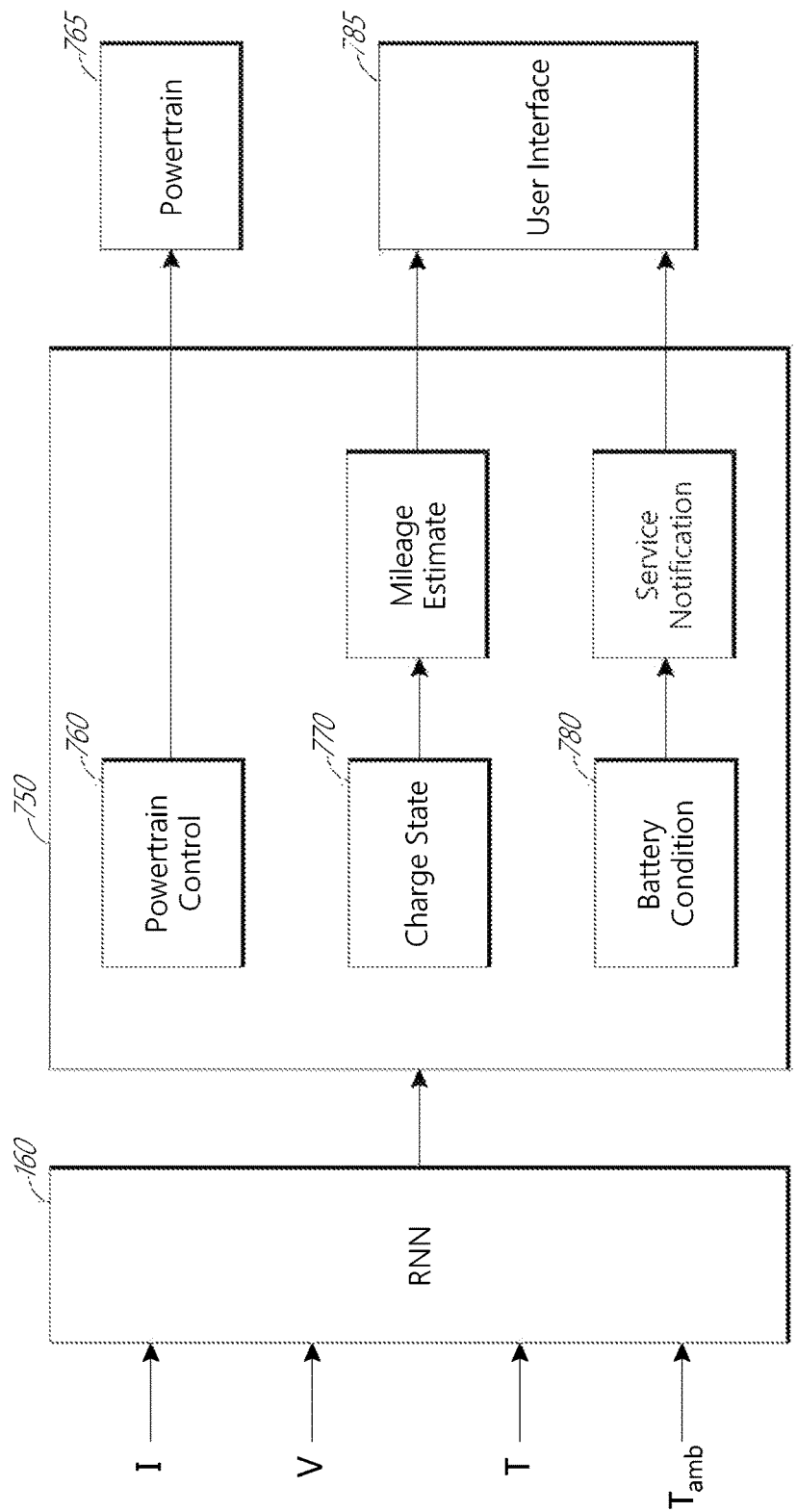
FIG. 7 is a block diagram depicting a vehicle battery monitoring and control system in accordance with an exemplary embodiment.

As mentioned above, the battery models described herein can be used in an electric vehicle for battery management and vehicle control. FIG. 7 is a block diagram depicting a vehicle battery monitoring and control system in accordance with an exemplary embodiment. The system may be a part of an electric or hybrid vehicle, and may include processing elements, a user interface, and a powertrain including a battery pack and one or more electric motors for propelling the vehicle. The battery monitoring and control system may include battery management system 160 (e.g. FIG. 2) that may include an RNN such as described above. The RNN may be implemented on processing circuitry to produce battery response and battery state determinations. Predictive outputs from the RNN may be sent to processing circuitry 750.

Processing circuitry 750 may include powertrain control circuitry 760 configured to control the vehicle's powertrain 765 based at least in part on the estimated battery state. The processing circuitry 750 may further include charge state estimating circuitry 770 configured to determine the charge state of the battery pack and mileage estimate circuitry configured to determine an estimated remaining driving range based on the charge state of the battery pack. The processing circuitry 750 may include battery condition circuitry 780 configured to assess the condition or health of the battery pack and service notification circuitry 785 configured to determine when battery service is required based on the condition or health of the battery pack. For example, to assess battery state of health, the RNN can be supplied with a test current, and the voltage response can be predicted. The magnitude of the voltage drop in response to the current is a measure of the battery internal resistance, which is in turn related to battery health. The mileage estimate circuitry 775 and service notification circuitry 785 may further be configured to communicate with a user of the vehicle through a user interface 790 to indicate the remaining driving range and/or notify the user that battery service is required.

Powertrain control circuitry 760 may use the RNN output to control the electric motors for vehicle propulsion. In some aspects, the powertrain control circuitry 760 may update or modify a pedal map based on the predicted response of the battery to a current or torque request. A pedal map can determine the amount of torque requested from the powertrain based on a position of the accelerator pedal depressed by a driver of the vehicle. The battery pack may have a diminished ability to produce torque in the one or more powertrain motors. Such conditions may be detectable by the powertrain control circuitry 760 based on voltage response predictions of the RNN. The powertrain control circuitry 760 may modify the powertrain's response to pedal inputs so as to avoid transmitting a torque request that the powertrain is unable to fulfill.

In some embodiments, the powertrain control circuitry 760 may calculate an instantaneous power limit based at least in part on the RNN predictions. The powertrain control circuitry 760 may then translate the instantaneous power limit into a maximum allowable torque command, which may be set to correspond to the fully depressed position of the accelerator pedal of the vehicle. Finally, the torque commands corresponding to all intermediate positions of the accelerator pedal may be set as desired to values between zero and the maximum allowable torque command. The powertrain control circuitry 760 may continuously and/or repeatedly update the pedal map based upon recalculated instantaneous power limits so as to optimize the performance of the vehicle powertrain. Repeated recalculation of the battery health by the battery condition circuitry 780 may allow for an immediate notification when the battery reaches a preset service requirement threshold, thereby avoiding potentially dangerous delays in required battery maintenance.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules, and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The foregoing description details certain embodiments of the systems, devices, and methods disclosed herein. It will be appreciated, however, that no matter how detailed the foregoing appears in text, the devices and methods can be practiced in many ways. As is also stated above, it should be noted that the use of particular terminology when describing certain features or aspects of the invention should not be taken to imply that the terminology is being re-defined herein to be restricted to including any specific characteristics of the features or aspects of the technology with which that terminology is associated. The scope of the disclosure should therefore be construed in accordance with the appended claims and any equivalents thereof.

With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity.

It is noted that the examples may be described as a process. Although the operations may be described as a sequential process, many of the operations can be performed in parallel, or concurrently, and the process can be repeated. In addition, the order of the operations may be rearranged. A process is terminated when its operations are completed. A process may correspond to a method, a function, a procedure, a subroutine, a subprogram, etc.

The previous description of the disclosed implementations is provided to enable any person skilled in the art to make or use the present disclosed process and system. Various modifications to these implementations will be readily apparent to those skilled in the art, and the generic principles defined herein may be applied to other implementations without departing from the spirit or scope of the disclosed process and system. Thus, the present disclosed process and system is not intended to be limited to the implementations shown herein but is to be accorded the widest scope consistent with the principles and novel features disclosed herein.

What is claimed is:

1. A battery powered apparatus comprising:
    a battery comprising one or more electrochemical cells, the battery having an output voltage and an output current when delivering power;
    a load driven by power delivered from the battery;
    a battery output current sensing circuit; and
    a battery management system comprising processing circuitry coupled to the battery output current sensing circuit, the processing circuitry configured to model a predicted output voltage of the battery with a battery model neural network comprising:
        a first recurrent neural network comprising a first input layer, a first hidden layer, and a first output layer, wherein a node of the first output layer generates a predicted temperature of the battery, and
        a second neural network comprising a second input layer, a second hidden layer, and a second output layer, wherein the second input layer includes a node that receives the predicted temperature from the node of the first output layer of the first recurrent neural network, and wherein the second output layer includes a node that generates the predicted output voltage of the battery,
        wherein a particular node of the first hidden layer receives a first input from a node of the first input layer and a second input from a previous time state of the first hidden layer, and wherein a particular node of the second hidden layer receives a first input from a node of the second input layer and a second input from a previous time state of the second hidden layer.

2. The battery powered apparatus of claim 1, wherein the second input layer of the second recurrent neural network has two additional input nodes corresponding to battery output current and integrated battery output current, respectively.

3. The battery powered apparatus of claim 1, wherein the first recurrent neural network includes first gating for generating the previous time state of the first hidden layer.

4. The battery powered apparatus of claim 1, further comprising:
    a sensor configured for sensing an output voltage of the battery; and
    a temperature sensor configured for sensing a temperature of the battery.

5. The battery powered apparatus of claim 4, wherein the battery management system is configured to:
    retrain the first neural network based on a difference between the predicted temperature and the sensed temperature; and
    retrain the second neural network based on a difference between the predicted temperature and the sensed output temperature.

6. The electric vehicle of claim 4, wherein the processing circuitry is configured to:
    retrain the first neural network based on a difference between the predicted temperature and the sensed temperature; and
    retrain the second neural network based on a difference between the predicted temperature and the sensed output temperature.

7. A method of operating a battery powered apparatus, the method comprising:
    driving a load of the apparatus with a battery;
    sensing the output current of the battery at defined intervals while driving the load;
    predicting an output voltage that will be exhibited by the battery under selected output current conditions using at least first and second recurrent neural networks each comprising an input layer, a hidden layer, and an output layer, wherein a particular node of the hidden layer receives a first input from a node of the input layer node and a second input from a previous time state of the hidden layer;
    using the first recurrent neural network to generate a predicted temperature of the battery;
    providing at least the predicted temperature as an input to the second neural network, wherein the second neural network generates the predicted output voltage; and
    driving the load of the apparatus with the selected current sourced from the battery.

8. The method of claim 7, comprising sensing an output voltage of the battery and sensing a temperature of the battery.

9. The method of claim 8, comprising, while driving the load of the apparatus with the battery:
    retraining the first neural network based on a difference between the predicted temperature and the sensed temperature; and
    retraining the second neural network based on a difference between the predicted temperature and the sensed output temperature.

10. An electric vehicle with a battery monitoring system, the vehicle comprising:
    a battery;
    a powertrain comprising at least one electric motor driven by the battery;
    a battery output current sensing circuit; and processing circuitry coupled to a battery output voltage sensing circuit and the battery output current sensing circuit, the processing circuitry configured to model behavior of the battery with at least first and second recurrent neural networks each comprising an input layer, a hidden layer, and an output layer, wherein a particular node of the hidden layer receives a first input from a node of the input layer and a second input from a previous time state of the hidden layer, wherein the first recurrent neural network models a predicted temperature of the battery, and wherein the processing circuitry provides the predicted temperature as input into the second recurrent neural network.

11. The electric vehicle of claim 10, wherein the second recurrent neural network has a single output layer node corresponding to a predicted output voltage of the battery.

12. The electric vehicle of claim 10, wherein the second recurrent neural network has a first input layer node corresponding to the predicted temperature and two additional input layer nodes corresponding to battery output current and integrated battery output current, respectively.

13. The electric vehicle of claim 12, comprising powertrain control circuitry that is configured to receive an output from the second recurrent neural network and control the powertrain based at least in part on the output.

14. The electric vehicle of claim 10, wherein the first recurrent neural network has a single output layer node corresponding to the predicted temperature.

15. The electric vehicle of claim 14, wherein the second neural network has an input layer node corresponding to the single output layer node of the first recurrent neural network.

16. The electric vehicle of claim 15, wherein the second recurrent neural network has a single output layer node that generates a predicted output voltage of the battery.

17. The electric vehicle of claim 10, wherein the processing circuitry is further configured to calculate a state of health of the battery using outputs of at least one of the first and second recurrent neural networks.

18. The electric vehicle of claim 10, wherein the processing circuitry is further configured to estimate an instantaneous power limit of the battery pack in real time based at least in part on outputs of at least one of the first and second recurrent neural networks.

19. The electric vehicle of claim 18, further comprising updating a pedal map of the electric vehicle based on the estimated instantaneous power limit.

20. The electric vehicle of claim 10, further comprising:
a sensor configured for sensing an output voltage of the battery; and
a temperature sensor configured for sensing a temperature of the battery.

* * * * *